US008987778B1

(12) United States Patent
Zu et al.

(10) Patent No.: US 8,987,778 B1
(45) Date of Patent: Mar. 24, 2015

(54) ON-CHIP ELECTROSTATIC DISCHARGE PROTECTION FOR A SEMICONDUCTOR DEVICE

(75) Inventors: Yue Zu, Plano, TX (US); Hoang Phung Nguyen, Carrollton, TX (US); Thomas E. Harrington, III, Carrollton, TX (US)

(73) Assignee: Maxim Integrated Products, Inc., San Jose, CA (US)

( * ) Notice: Subject to any disclaimer, the term of this patent is extended or adjusted under 35 U.S.C. 154(b) by 58 days.

(21) Appl. No.: 12/639,852

(22) Filed: Dec. 16, 2009

(51) Int. Cl.
*H01L 29/66* (2006.01)

(52) U.S. Cl.
USPC ............ 257/173; 257/355; 438/133; 438/140

(58) Field of Classification Search
CPC ............... H01L 2924/00014; H01L 23/60; H01L 23/62; H01L 27/0251; H01L 27/0255; H01L 27/0266; H01L 27/0262; H01L 27/0292; H01L 27/0296; H01L 27/0259
USPC ............................ 257/173, 355; 438/133, 140
See application file for complete search history.

(56) References Cited

U.S. PATENT DOCUMENTS

| | | | |
|---|---|---|---|
| 5,825,601 A | 10/1998 | Statz et al. | |
| 5,946,177 A | 8/1999 | Miller et al. | |
| 6,587,320 B1* | 7/2003 | Russ et al. | 361/56 |
| 6,862,160 B2 | 3/2005 | Maloney et al. | |
| 2002/0153571 A1 | 10/2002 | Mergens et al. | |
| 2003/0201457 A1 | 10/2003 | Lin et al. | |
| 2004/0027742 A1 | 2/2004 | Miller et al. | |
| 2004/0109270 A1 | 6/2004 | Stockinger et al. | |
| 2005/0045955 A1* | 3/2005 | Kim et al. | 257/355 |
| 2008/0023766 A1* | 1/2008 | Hung et al. | 257/355 |
| 2008/0310059 A1* | 12/2008 | Wu et al. | 361/56 |
| 2010/0171149 A1* | 7/2010 | Denison et al. | 257/173 |
| 2010/0264508 A1* | 10/2010 | Stecher et al. | 257/503 |

OTHER PUBLICATIONS

W.D. Mack and R. G. Meyer, "New ESD Protection Schemes for BiCMOS Process with Applications to Cellular Radio Design", IEEE ISCAS Proceedings, May 1992, pp. 2699-2702.
M. Stockinger, J.W. Miller, M.G. Khazhinsky, C.A. Torres, J.C. Weldon, B.D. Preble, M.J.Bayer, M. Akers, V.G. Kamat Motorola, "Boosted and Distributed Rail Clamp Networks for ESD Protection in Advanced CMOS Technologies", EOS/ESD Symposium Proceedings, 2003.

* cited by examiner

*Primary Examiner* — Shaun Campbell
(74) *Attorney, Agent, or Firm* — Advent LLP

(57) ABSTRACT

Embodiments of the invention provide increased ESD protection suitable for high-voltage devices. In one embodiment, an internal DMOS circuit is placed in parallel with a lateral NPN ESD clamp. The clamp has both a high holding voltage, above the operating voltage of the DMOS circuit, and a high maximum current before breakdown. The discharge path of the clamp includes a high-voltage lightly doped well containing a low-voltage higher doped well. The dopant of both wells is the same type, and the interface between the two defines a graded junction. The emitter of the entire circuit is grounded and the collector is coupled to the voltage of the DMOS circuit.

14 Claims, 11 Drawing Sheets

ON-CHIP ELECTROSTATIC DISCHARGE PROTECTION FOR A SEMICONDUCTOR DEVICE

FIELD OF THE INVENTION

This invention relates to semiconductor devices. More specifically, this invention relates to electrostatic discharge protection for semiconductor devices.

BACKGROUND OF THE INVENTION

Protecting high-voltage devices from ESD events poses difficult challenges, challenges that are not adequately solved by devices in the prior art. As one example, self-protected double diffused metal-oxide semiconductor ("DMOS") devices have low holding voltages and are latch-up sensitive. Because these devices cannot remove themselves from a high-current mode, they are easily destroyed. Furthermore, these devices show unstable performance. Because a DMOS device is not designed to uniformly carry current, a portion of the device may be destroyed before the rest can turn ON and shunt ESD current to ground.

Other prior art devices rely on stacking low-voltage snapback structures. One drawback of these devices is that they may have a turn ON voltage above the breakdown voltage of the device being protected. Another drawback is that they cannot be finely tuned. Their operating voltage is increased by "stacking" individual low-voltage snapback elements. Accordingly, the voltage can only be increased by discrete amounts and cannot be precisely scaled to specific applications.

Still other prior art structures use an active-drive core clamp. These clamps use an RC circuit to control the DMOS gate to make it turn ON during an ESD event and then OFF after the ESD event dissipates. Such circuits may be adequate for low-voltage devices, but because the RC component must also operate at high voltages, these components may not be available for high-voltage and may require a relatively large layout area.

SUMMARY OF THE INVENTION

In a first aspect of the invention, a semiconductor device includes a circuit element in parallel with a first electrostatic discharge path. The first electrostatic discharge path includes first and second high-voltage wells having opposite polarities. The first high-voltage well contains a graded junction.

In one embodiment, the graded junction is formed by an intermediate well within the first high-voltage well. The intermediate well has a doping concentration larger than but of a same polarity as a doping concentration of the first high-voltage well. The second high voltage well has a high doping diffusion region of the opposite polarity.

The intermediate well forms a collector of the semiconductor device and the second high-voltage well focus the base of the semiconductor device. A high doping diffusion in the second well forms the emitter.

Preferably, the emitter and the base are grounded and the collector and the circuit element are both coupled to a pad. In one embodiment, the emitter and the collector are separated by a distance that provides a holding voltage above an operating voltage of the circuit element.

In another embodiment, the semiconductor device also includes a third high-voltage well of the same polarity as the second high-voltage well. The first and third high-voltage wells form a second electrostatic discharge path in parallel with the first electrostatic discharge path.

In a second aspect of the invention, a semiconductor substrate includes a high-voltage circuit element, such as a DMOS, and one or more pairs of electrostatic discharge paths in parallel with the high-voltage circuit element. Preferably, the device has its collector ringed or surrounded by both a base and an emitter.

In a third aspect of the invention, a semiconductor substrate includes a DMOS circuit and an ESD structure that includes one or more pairs of electrical discharge paths in parallel with the DMOS circuit. Each of the discharge paths includes adjacent first and second high-voltage wells. Each of the first high-voltage wells contains an intermediate well, thereby defining a graded junction.

In one embodiment, a turn-on voltage of the ESD structure is above a maximum operating voltage of the DMOS circuit, such as at least 40 V. Preferably, the ESD structure includes only 4, 5 or 6 pairs of electrical discharge paths.

In a fourth aspect of the invention, a method of forming a semiconductor device having electrostatic discharge protection includes forming on a semiconductor substrate an ESD structure and an internal circuit parallel to one another. The ESD structure includes one or more pairs of discharge paths each containing a graded junction to ground.

DETAILED DESCRIPTION OF THE EMBODIMENTS

In accordance with embodiments of the invention, on-chip ESD protection is provided for high-voltage devices. In one embodiment, a lateral NPN ESD clamp is placed in parallel with a high-voltage device. The holding voltage of the device is controlled above its maximum supply voltage, thereby making it essentially latch-up free. The high-voltage device is capable of surviving increased ESD currents.

The clamp turns on at a voltage between the maximum operating voltage and the breakdown voltage of the high-voltage internal device being protected. After turning on, the clamp holds at a voltage above the maximum operating voltage. The clamp has a low resistance and is able to shunt large ESD currents without being damaged.

Embodiments are particularly suitable for DMOS devices, which are characterized by being latch-up sensitive and having low holding voltages. Because of these characteristics, if an unprotected DMOS device is accidentally triggered, it will hold at a voltage lower than its operating voltage (e.g., 40 V) and will not be able to recover from the high current mode, resulting in damage of the device. Preferably, the NPN ESD clamp in accordance with embodiments of the present invention shunts 3 Amps or more, currents larger than can be shunted using prior art circuitry. By handling these currents in a reliable and consistent manner, the internal circuits are protected.

Figure 1:
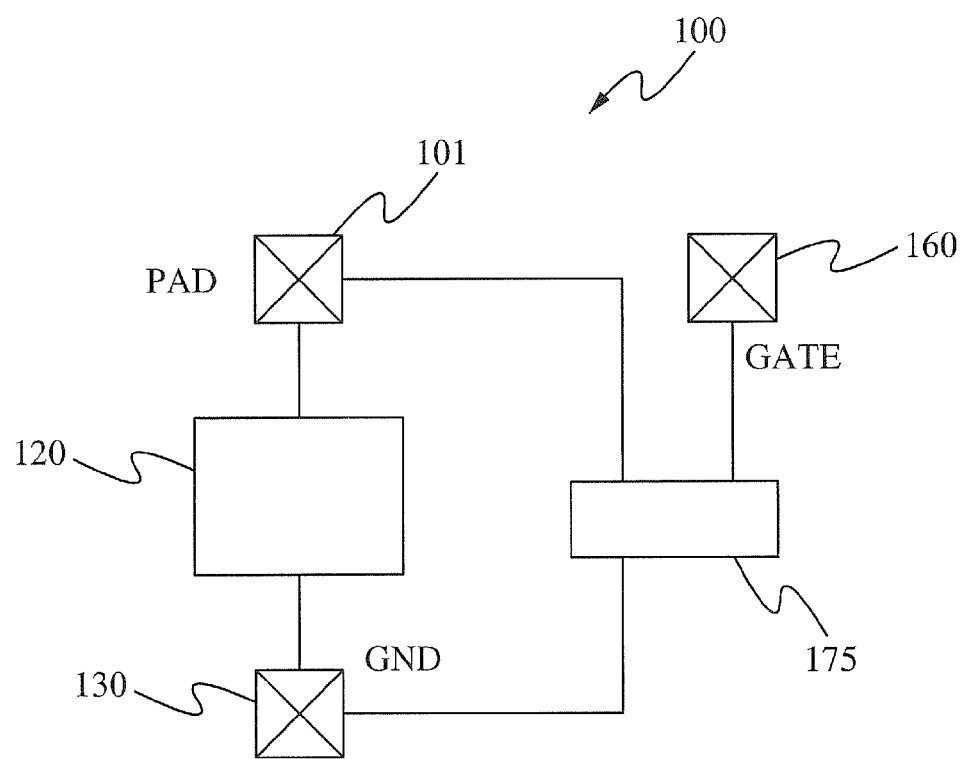
FIG. 1 is a high-level block diagram of an ESD element and a protected internal circuit in accordance with one embodiment of the invention.

FIG. 1 is a block diagram of a structure 100 that protects a high-voltage circuit 175 from ESD events in accordance with one embodiment of the invention. The structure 100 includes a lateral NPN ESD clamp 120 coupled in parallel with the circuit 175: Both the clamp 120 and circuit 175 are coupled to a voltage pad 101 and a ground pad 130. The circuit 175 is also coupled to a gate 160 of the structure 100.

In operation, an electrostatic charge approaching the structure 100 is discharged through the clamp 120 before it can discharge to and thus damage the circuit 175. The clamp 120 turns ON before the breakdown voltage of the circuit 175 and snaps back to above the maximum operating voltage (AMR), thereby ensuring that the circuit 175 is latch-up free. The clamp 120 has a low on-resistance allowing it to shunt a large ESD current without being destroyed.

In one embodiment, the high-voltage circuit 175 is a DMOS circuit, and the clamp 120 protects the circuit 175 without adding ballasting resistance to the DMOS drain. It will be appreciated that other high-voltage circuits, such as those operating between 10 V and 100 V, can be protected using embodiments of the invention. Of course, high-voltage circuits with other operating voltages can also be protected.

Figure 2A:
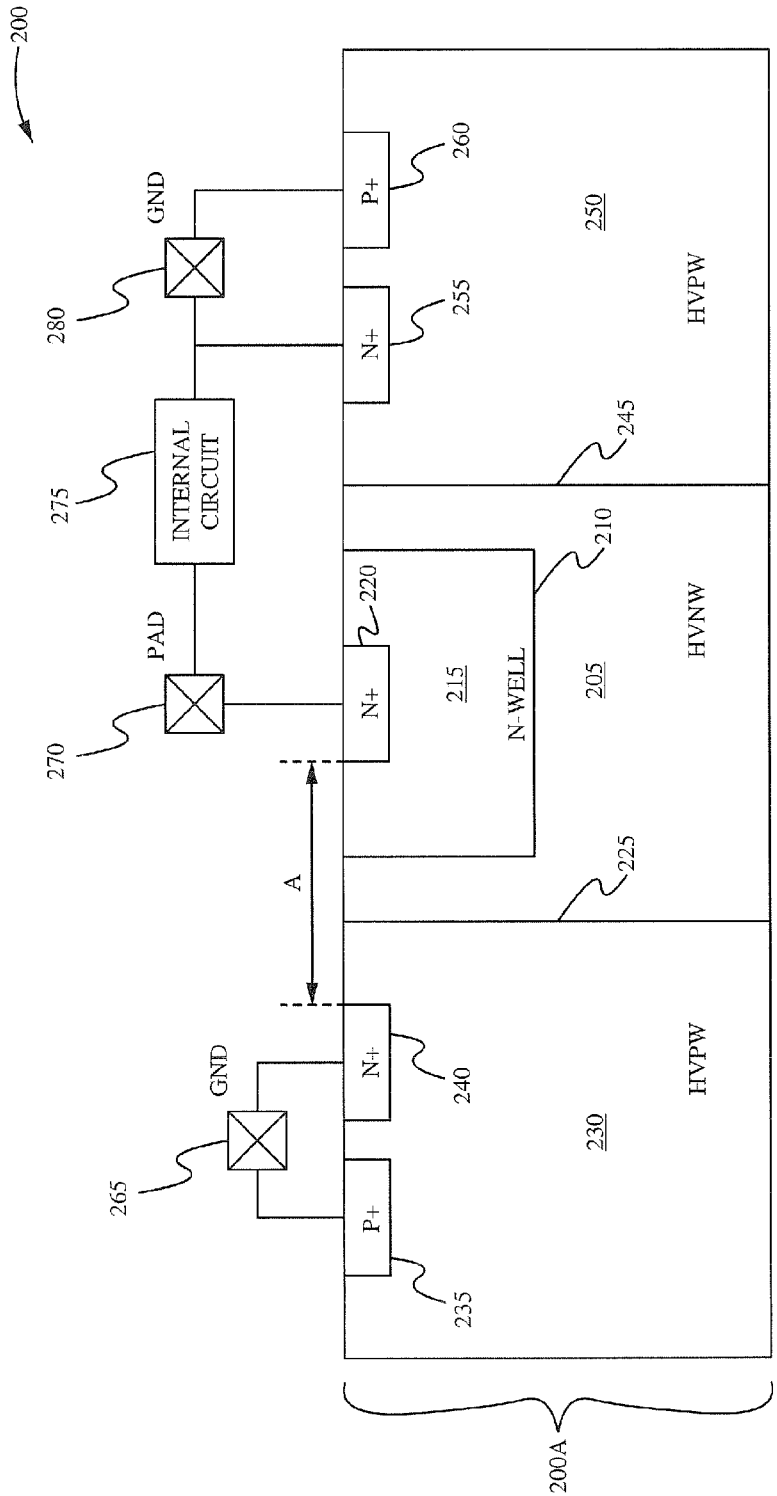
FIG. 2A is a side cross-sectional view of an ESD element and an internal circuit in accordance with one embodiment of the present invention.

FIG. 2A is a side cross-sectional view of an electronic device 200 incorporating an ESD protection structure 200A that protects an internal circuit 275 in accordance with one embodiment of the invention. The ESD structure 200A includes a High-Voltage N-well (HVNW) 205 (e.g., collector) sandwiched between two High-Voltage P-wells (HVPW) 230 and 250. The HVNW 205 contains a low-voltage N-well 215, which in turn contains an N+ well pickup region 220. The HVNW 205 has a relatively low doping concentration, the low-voltage N-Well 215 has a doping concentration larger than that of the HVNW 205, and the N+ region 220 has a doping concentration larger than that of the N-Well 215.

In many devices, a single substrate supports both a high-voltage device and a low-voltage regular device. In such devices, the HVNW 205 is used to build the high-voltage device, the low-voltage N-well 215 is used to build the low-voltage regular device, and the N+ region 220 is generic for all the well pick-ups.

Together, the HVNW 205 and the N-Well 215 form a graded junction 210. Two different doping concentrations are provided to form the graded junction 210, thereby increasing the secondary breakdown current of the structure 200A. The graded junction 210 provides for better high current carrying capability, thereby reducing junction, and thus localized, heating. As illustrated below in FIG. 5, without the intermediate N-Well 215, the I-V curve will enter secondary breakdown much sooner, resulting in earlier device failure.

The HVPW 230 contains a P+ region (well pickup) 235 and an N+ region (emitter) 240, both coupled to a ground pad 265. The collector (at voltage) and emitter (at ground) are switched from prior art structures, in which the collector is grounded and the emitter is at voltage. The HVPW 250 is "symmetrical" with the HPVW 230, which also contains an N+ region 255 and a P+ region 260, both coupled to a ground pad 280. The HVPW 250 has a doping concentration similar to that of HVPW 230, the N+ region 255 has a doping concentration similar to that of the N+ region 240, and the P+ region 260 has a doping concentration similar to that of the P+ region 235.

In one embodiment, the doping concentrations of the HVNW 205 and the HVPWs 230 and 250 are approximately 1E+16; the doping concentration of the N-Well 215 (and the P-Wells 330 and 365 of FIG. 4) is approximately between 1E+17 and 1E+18; and the doping concentrations of the N+ regions 220, 240, and 255 and the P+ regions 235 and 260 are approximately 1E+20. These concentrations are merely exemplary. Those skilled in the art will recognize other doping concentrations that can be used in accordance with embodiments of the invention.

The device 200 also includes an internal circuit 275 (e.g., a DMOS device or other high-voltage circuit component) parallel to and protected by the ESD structure 200A. The internal circuit 275 is coupled across the pad 270 and the ground 280.

Figure 2B:
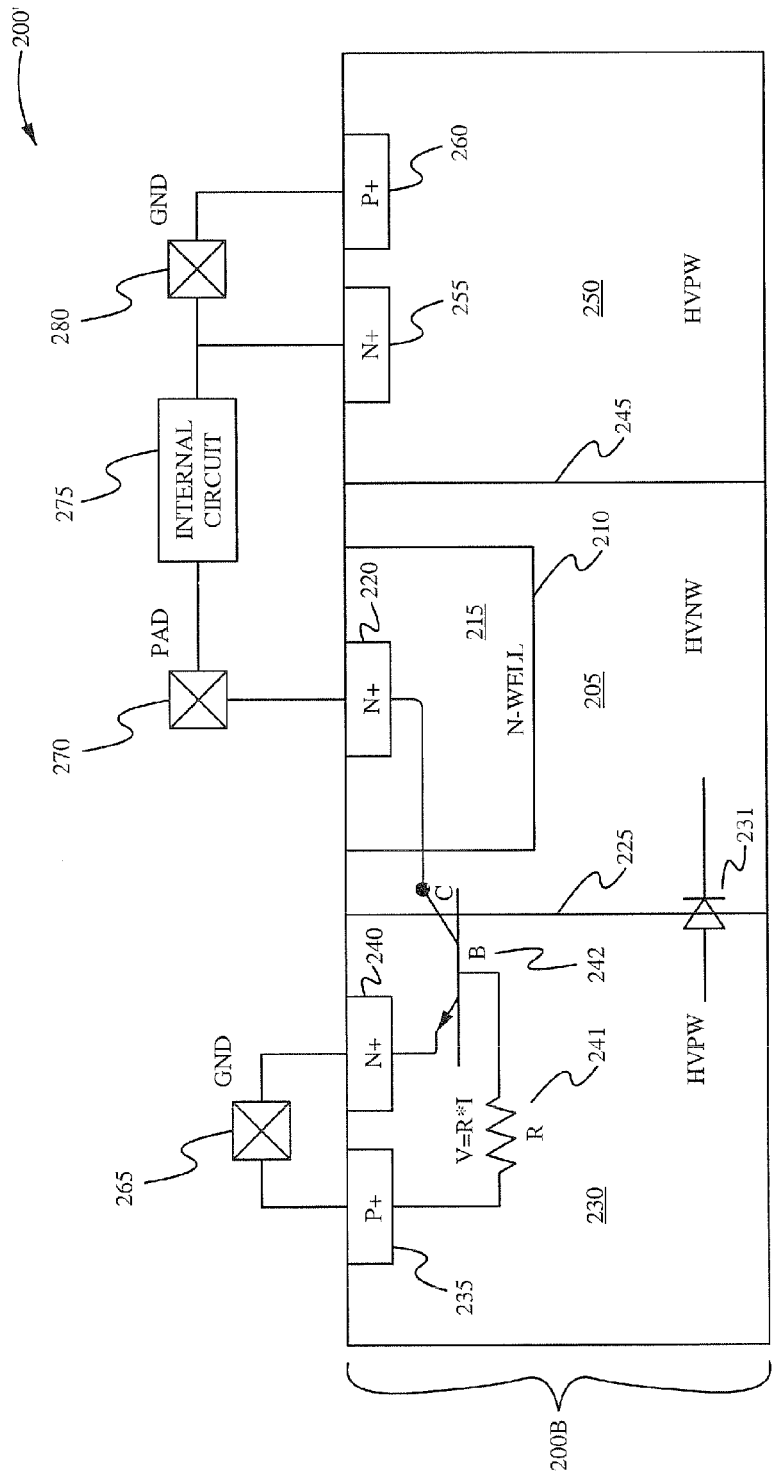
FIG. 2B shows the elements of FIG. 2A, with the functionally equivalent circuits superimposed.

FIG. 2B is the same side cross-sectional view of FIG. 2A, but schematically showing the functional circuit elements formed on the ESD structure 200A. As in all figures, identical labels refer to the same element. As shown in FIG. 2B, schematically, a diode 231 is formed across the junction 225, an NPN transistor 242 having a collector and emitter is formed between the N+ wells 220 (collector) and 240 (emitter), and a base is formed with the P+ region 235. Generally, the HVNW 230 is referred to as the device collector, the HVPW 230 as the device base, and the N+ region 240 as the device emitter. FIG. 2B is used to explain the operation of the ESD structure 200A when an ESD event occurs.

Figure 5:
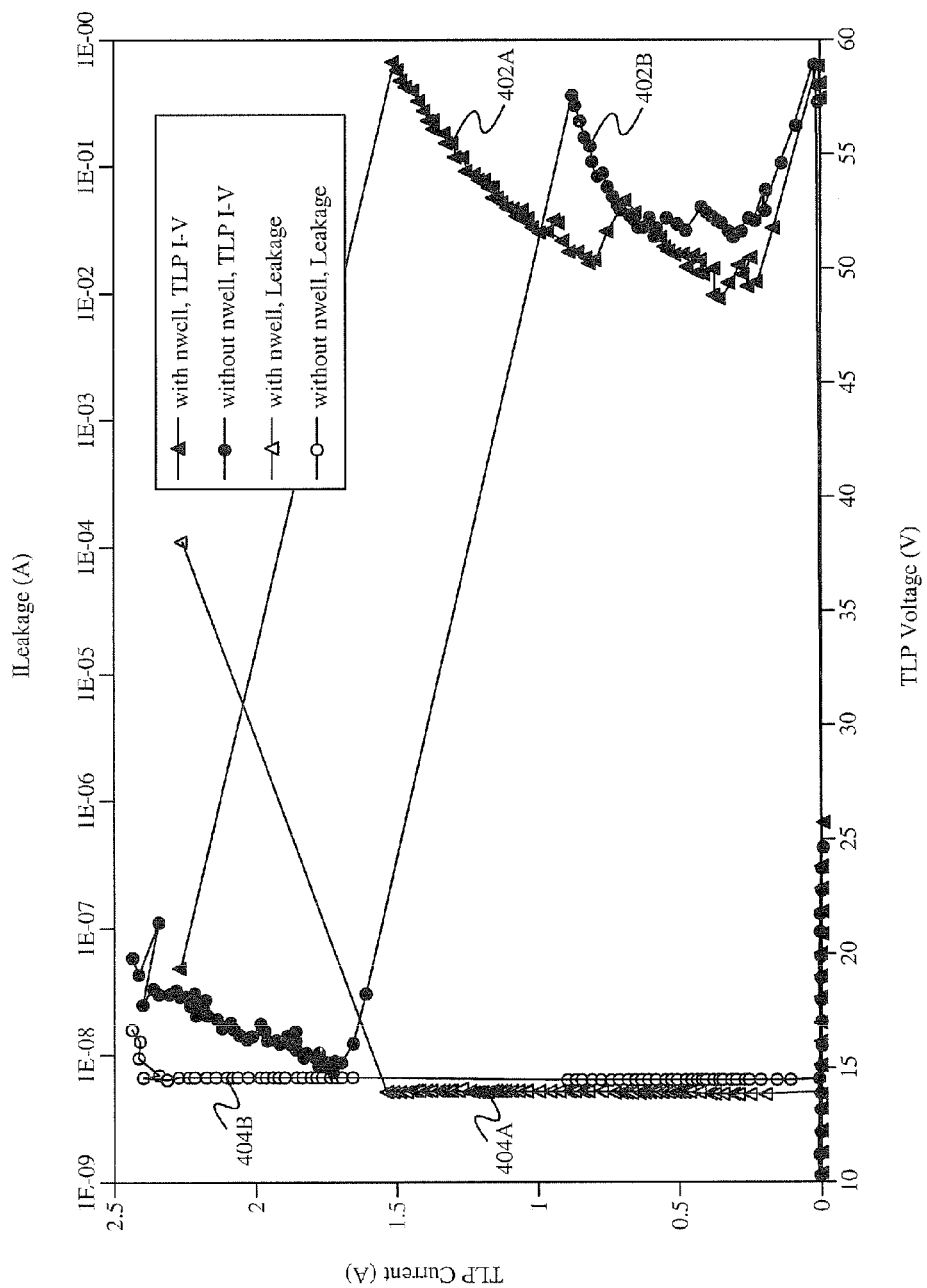
FIG. 5 shows the results of TLP testing, illustrating the effectiveness of using a graded junction for ESD protection in accordance with embodiments of the present invention.

Referring to FIG. 2B, in operation, when an ESD event strikes the device 200, an ESD current goes through the pad 270 and across the junction 225 (e.g., the diode 231). A voltage of 50 V or more causes a breakdown in the avalanche junction 225. The ESD current flows across the HVPW 230, which has an equivalent resistance from the junction 225 to the P+ region 235, shown schematically as the resistor 241. Accordingly, when the current flows through the resistor 241, it will create a voltage drop equal to R*I. When this voltage drop is greater than 0.7 V, the voltage needed to bias the P+235 to N+240 emitter-base junction of the transistor 242, the bipolar starts to take effect. The current thus goes through the avalanche junction as well as the bipolar. The effect is illustrated in FIG. 5 below. In this way, a large current is handled with a very low resistance across the avalanche structure 225 so that the ESD voltage and the current can be quickly removed from the pad 270.

Still referring to FIG. 2B, a discharge path is defined by the pad 270, the N+ region 220, the N-well 215, the HVNW 205, the HVPW 230, the N+ region 240, and the ground pad 265, in that order.

The HVPW 250 is a mirror image of the HVPW 230, placed on the opposite side of the HVNW 205 so that the ESD current does not crowd into one side of the device 200. Instead, the current is evenly dissipated by flowing into each of the mirror emitters 240 and 255. The HVPWs 230 and 250 thus provide a pair of discharge paths. They are structurally and functionally equivalent and, for this reason, are said to be "symmetrical." The second discharge path provided by the HVPW 250 is defined by the pad 270, the N+ region 220, the N-well 215, the HVNW 205, the HVPW 250, the N+ region 255, and the ground pad 280, in that order.

Figure 3:
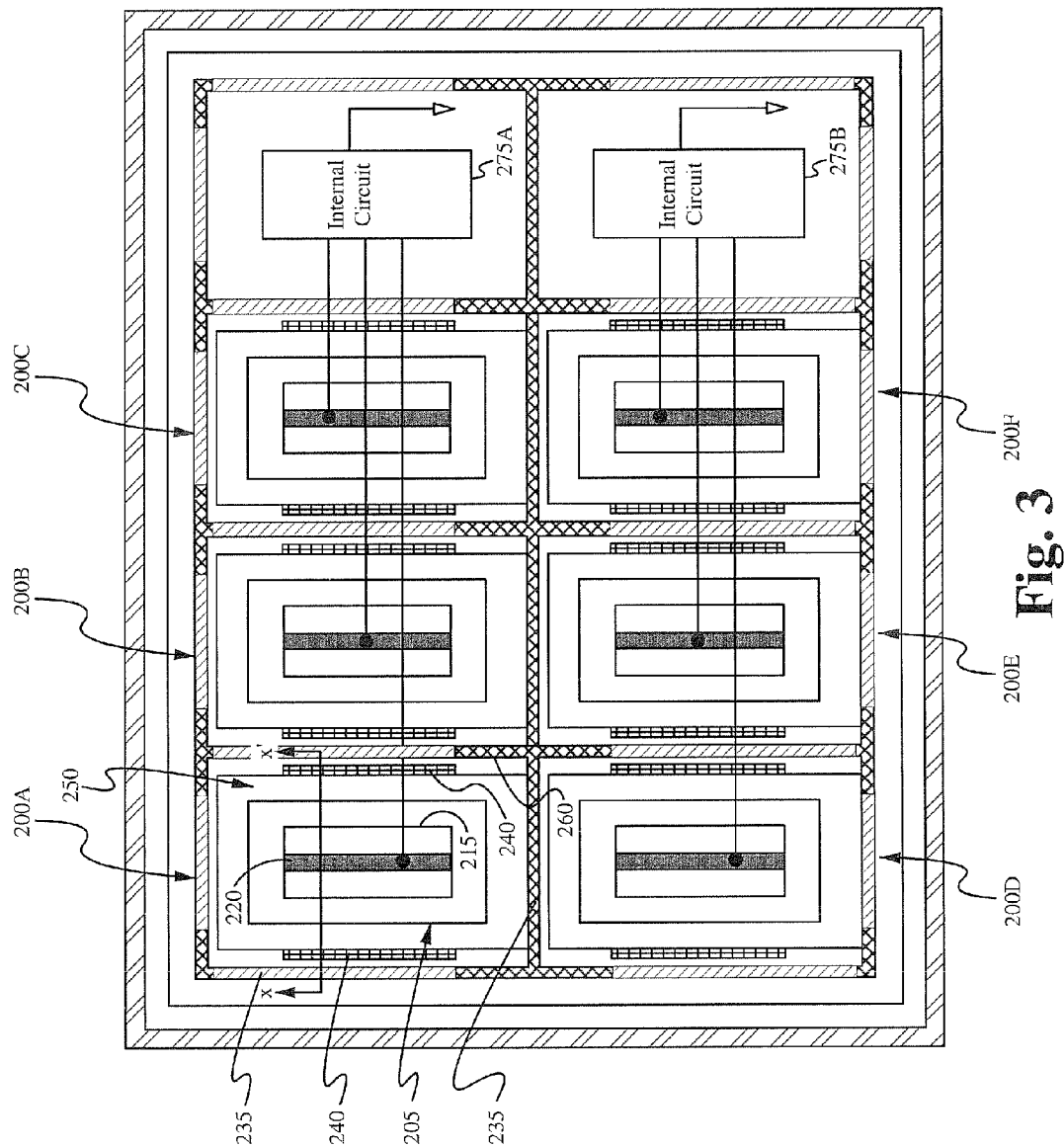
FIG. 3 illustrates the layout of multiple parallel ESD elements for protecting internal circuits in accordance with one embodiment of the present invention.

FIG. 3 is a layout of a substrate containing the symmetrical ESD element 200A and similar ESD elements 200B-200F. Referring to both FIGS. 2A and 3, the cross-sectional view 200A of FIG. 2 is taken along the line X-X' of FIG. 3. FIG. 3 also shows two internal circuits 275A and 275B (both similar to the internal circuit 275 of FIG. 2A). The exemplary internal circuit 275 is in parallel with multiple ESD elements 200A-C. As explained in more detail below, placing an internal circuit in parallel with multiple ESD elements in accordance with embodiments of the invention provides increased, scalable protection from ESD events.

As illustrated in FIG. 3, the layout of the device 200 is fingered, with emitter regions 230 and 250 flanking a collector 215 at the center, surrounded by both the base 235 and 260 and the emitters 230 and 250 as a ring. This layout ensures uniform current flow and maximum collection of injected current.

Figure 4:
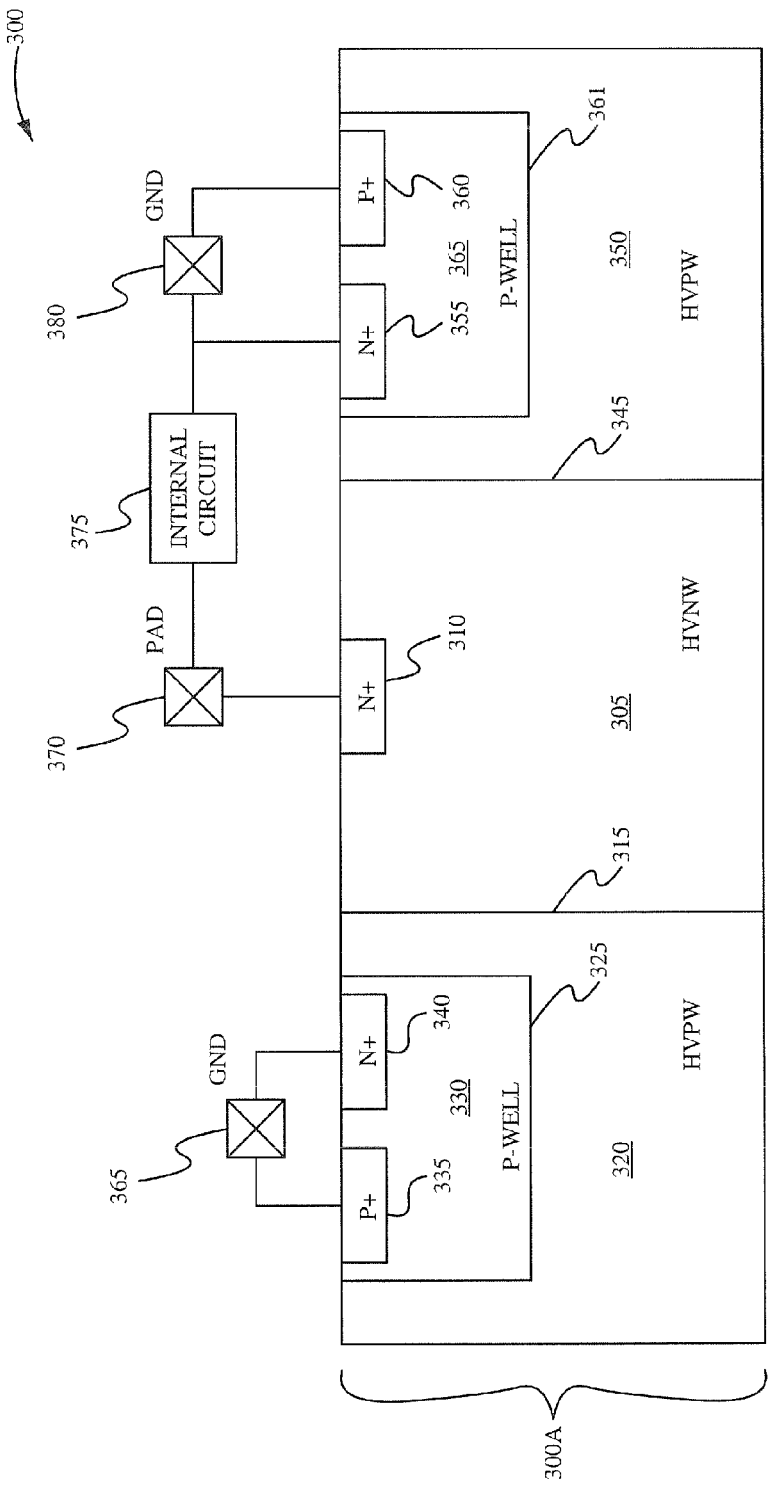
FIG. 4 is a side cross-sectional view of an ESD element and an internal circuit in accordance with another embodiment of the present invention.

Embodiments of the invention can be configured in different ways. For example, a graded junction can be provided on the emitter side of the device rather than the collector side. FIG. 4 shows a device 300 with a symmetrical ESD structure 300A. The structure 300A includes an HVNW 305 flanked by similarly structured HVPW 320 and HVPW 350. The HVNW 310 contains an N+ region 310 coupled to a pad 370, which in turn is coupled to an internal circuit 375, similar to the internal circuit 275 of FIG. 2A. The internal circuit 375 is coupled to the ground pin 380 and is electrically in parallel with the ESD protection structure 300A.

The HVPW 320 contains an intermediate P-well 330, which in turn contains a P+ region 335 and an N+ region 340, both coupled to a ground pin 365. The HVPW 320 has a relatively low doping concentration, the low-voltage P-Well 330 has a doping concentration higher than that of the HVPW 320, and the P+ region 335 has a doping concentration higher than that of the P-Well 330. Again, the multiple, relative doping concentrations of the intermediate P-well 330 and the HVPW 320 define a graded junction 325. An ESD discharge path includes the pad 370, the N+ well 310, the HVNW 305, the HVPW 320, the P-Well 330, the N+ region 340, and the ground pad 365.

Testing Using the Transmission Line Pulse Method

FIGS. 5, 6, and 8-10 all show curves plotting experimental data, illustrating the effectiveness of ESD protection structures in accordance with embodiments of the invention. All of the data points were generated using the Transmission Line Pulse ("TLP") method to produce electrical pulses to simulate ESD events on two devices: one that included an ESD protection structure in accordance with the present invention (e.g., the device 200A of FIG. 2) and one that did not include this structure. By comparing these results, the effectiveness of the ESD protection structures was determined.

Each point on the curves (e.g., ▲, ●, ∆, ○) refers to a measurement generated from a single pulse. When testing devices (device under test, or "DUT") in accordance with the present invention, measurements were taken across the internal circuit (e.g., the "input pad" such as 270) and ground (e.g., ground 280), generating the device I-V characteristic curve. After each pulse, the DUT was checked in the following manner to determine whether it had been damaged: 40 V was applied across the input pad and the ground and the current measured. Normally, the DUT is in the OFF state and has a low leakage current. If more than a nominal current was detected, the DUT was determined to be permanently damaged. The leakage current is referenced by the top horizontal axis of each graph.

FIG. 5 is used to illustrate how devices that use low-voltage N-wells (e.g., element 215 in FIG. 2A) provide increased ESD protection: Referring to FIG. 5, the curve 402A (data points ▲) shows a TLP I-V curve for the device 200A, which has a low-voltage N-well and thus a graded junction (e.g., 210, FIG. 2A) in accordance with embodiments of the invention. For comparison, the curve 402B (data points ●) shows a TLP I-V curve for a structure that does not include a graded junction in accordance with embodiments of the invention.

The curve 404A (data points ∆) plots leakage for the device 200 A. For comparison, the curve 404B (data points ○) plots leakage for a structure that does not include a graded junction.

As shown in FIG. 5, the DUT was OFF so that the voltage increases and the current stays low, resulting in breakdown at 58 V at the avalanche junction. Next, the DUT starts to enter the ON mode, then drops to a lower voltage. The bipolar transistor then turns ON and the DUT enters a low resistance mode able to handle high currents: the current increases but the voltage is relatively stable.

As shown by the curves 402A and 404A, the voltage is kept above 40 V, and the DUT does not break down until the current reaches about 1.5 A. In comparison, referring to the curves 402B and 404B, the voltage snapped back into a low holding voltage (15 V) when the current reached just below 1 A. The curves 402B and 404B do not reflect good ESD protection. These curves show that the current goes above 1 A and then snaps back to a low voltage. Because the DUT enters into a low holding voltage state less than the operating voltage of the internal circuit, latch-up can occur. Because the curves 402A and 404A stay above the operating voltage for a higher current, they reflect better ESD protection.

Figure 6:
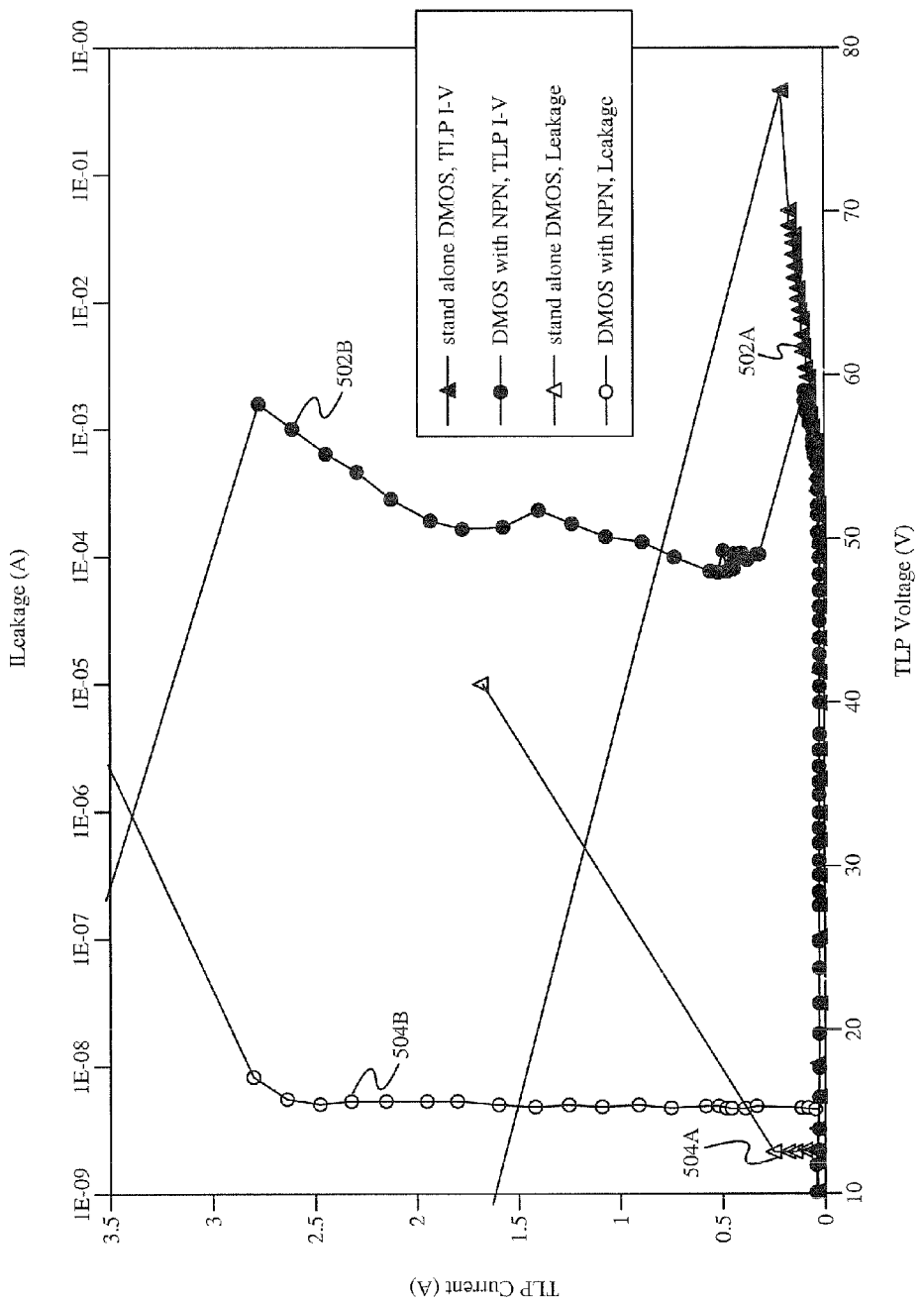
FIG. 6 shows the results of TLP testing, illustrating the effectiveness of ESD protection in accordance with other embodiments of the present invention.

FIG. 6 shows experimental data generated using the TLP method, comparing current and leakage for a DMOS device without an NPN ESD clamp (curves 502A and 504A) and one with an NPN ESD clamp (curves 502B and 504B). As shown in the curves 502A and 504A, voltage builds up to almost 80 V before the DMOS junction breaks down. Then, the leakage current spikes up, evidencing destruction of the unprotected DMOS. The curves 502A and 504A illustrate that the unprotected device can only take a maximum of 0.2 A or 300 V (HBM). Using the same analysis as in FIG. 5, those skilled in the art will recognize where device damage occurs in FIGS. 6 and 8-10.

Referring to the curve 502B, the voltage increases to about 60 V before the device enters NPN snapback mode. As illustrated by the curve 504B, the current starts to rise until thermal breakdown, and at a current of approximately 2.6-2.7 A, the device is destroyed. A comparison of the curves 502A and 504A versus 502B and 504B illustrates that the protection provided by ESD structures in accordance with some embodiments of the invention increases the protection to over 4,000 V (HBM).

In accordance with different embodiments, the ESD protection performance can be tailored by varying, among other things, (1) the number of ESD protection elements coupled to a single internal circuit, (2) the spacing between the emitter and collector, or (3) any combination of these.

Figure 7:
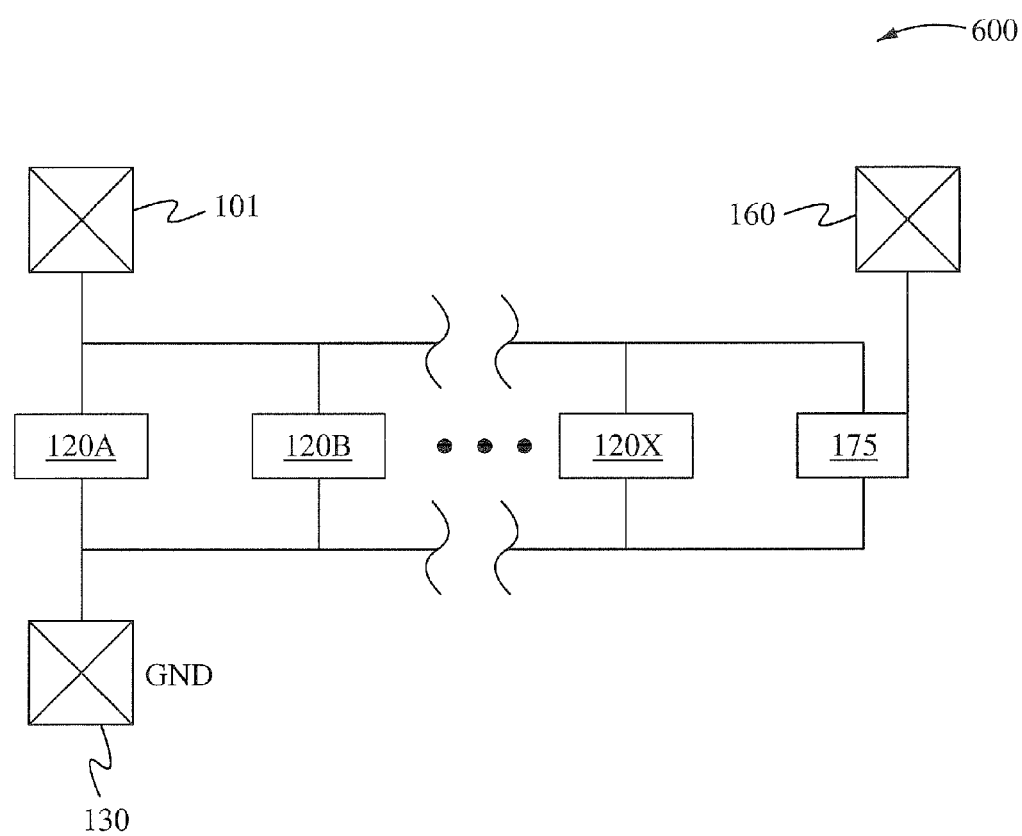
FIG. 7 is a block diagram of a device protected using multiple parallel ESD structures in accordance with one embodiment of the present invention.

FIG. 7 is a block diagram of a structure 600 incorporating multiple parallel ESD protection elements 120A-X, all similar to the ESD protection element 120 of FIG. 1. Referring to FIGS. 1 and 7, the same reference number refers to the same element. Placing the multiple ESD protection elements 120A-X in parallel increases the ESD protection capabilities of the structure 600. For example, if the structure 600 must be capable of protecting against an ESD current of 1.5 A, a single ESD protection element 120A (with two discharge paths) is included. If the structure 600 must be capable of protecting against an ESD current of 3.0 A, two ESD protection elements 120A and 120B are included. In this way, the structure 600 is easily scalable: the number of ESD protection elements can be selected to fit the application at hand.

Figure 8:
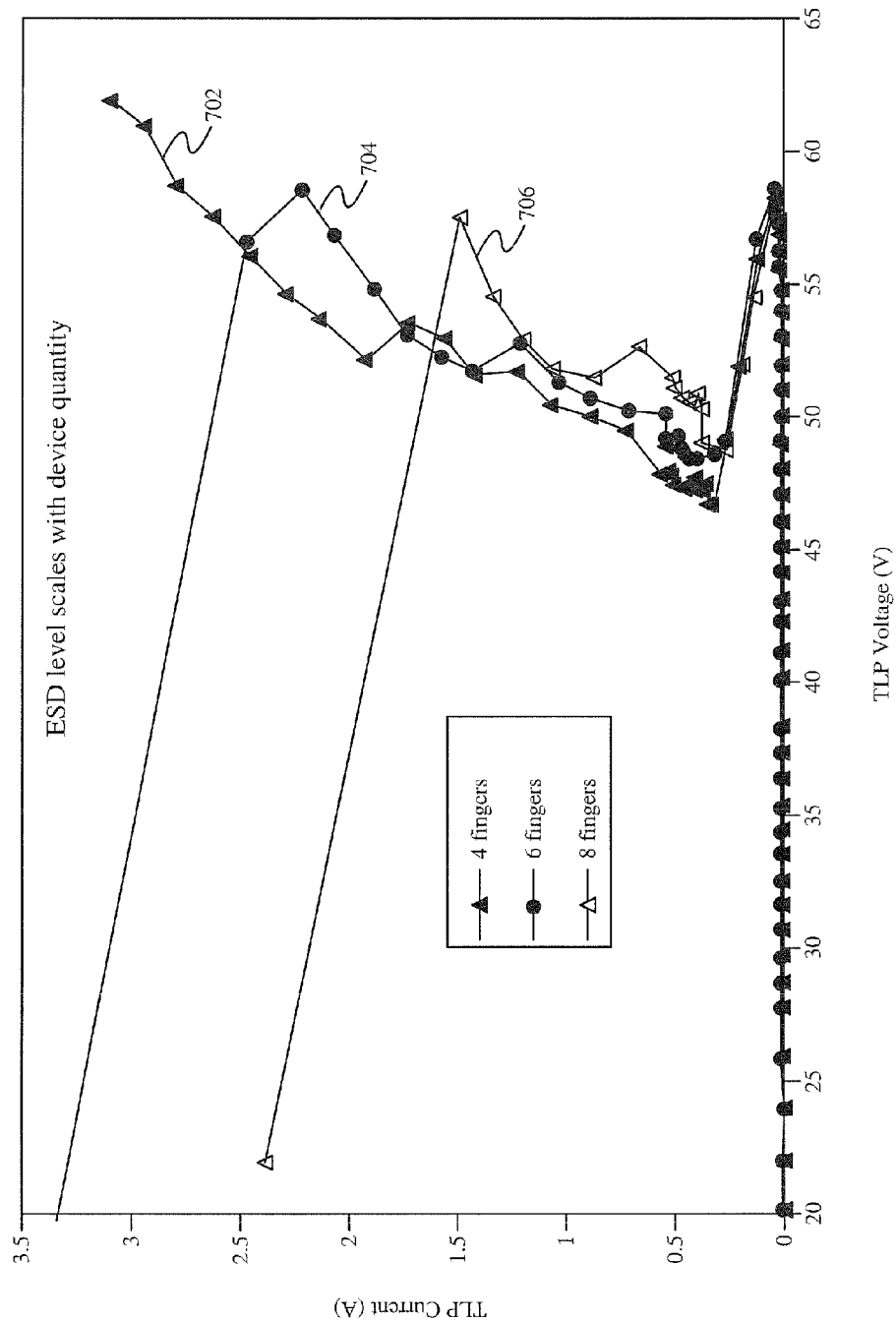
FIG. 8 shows the results of TLP testing, illustrating the effect of using multiple parallel ESD structures in accordance with embodiments of the present invention.

FIG. 8 shows three curves plotting TLP current versus TLP voltage for a device having 4 (curve 702), 6 (curve 704), and 8 (curve 706) "fingers" in accordance with embodiments of the invention. Referring to FIG. 2A, the structure 200A, including the HVNW 205 and the symmetrical HVPWs 230 and 250, is referred to as a "finger." As illustrated by the curve 702, 4 fingers, all in parallel with an internal device, shunt about 1.5 A TLP current, which is equivalent to 2.2 KV Human Body Model ("HBM") stress. The curve 704 illustrates that 6 fingers in parallel shunt about 2.4 A TLP current, which is equivalent to 3.6 KV HBM stress. And the curve 706 illustrates that 8 fingers in parallel shunt about 3 A TLP current, which is equivalent to 4.5 A HBM stress.

Figure 9:
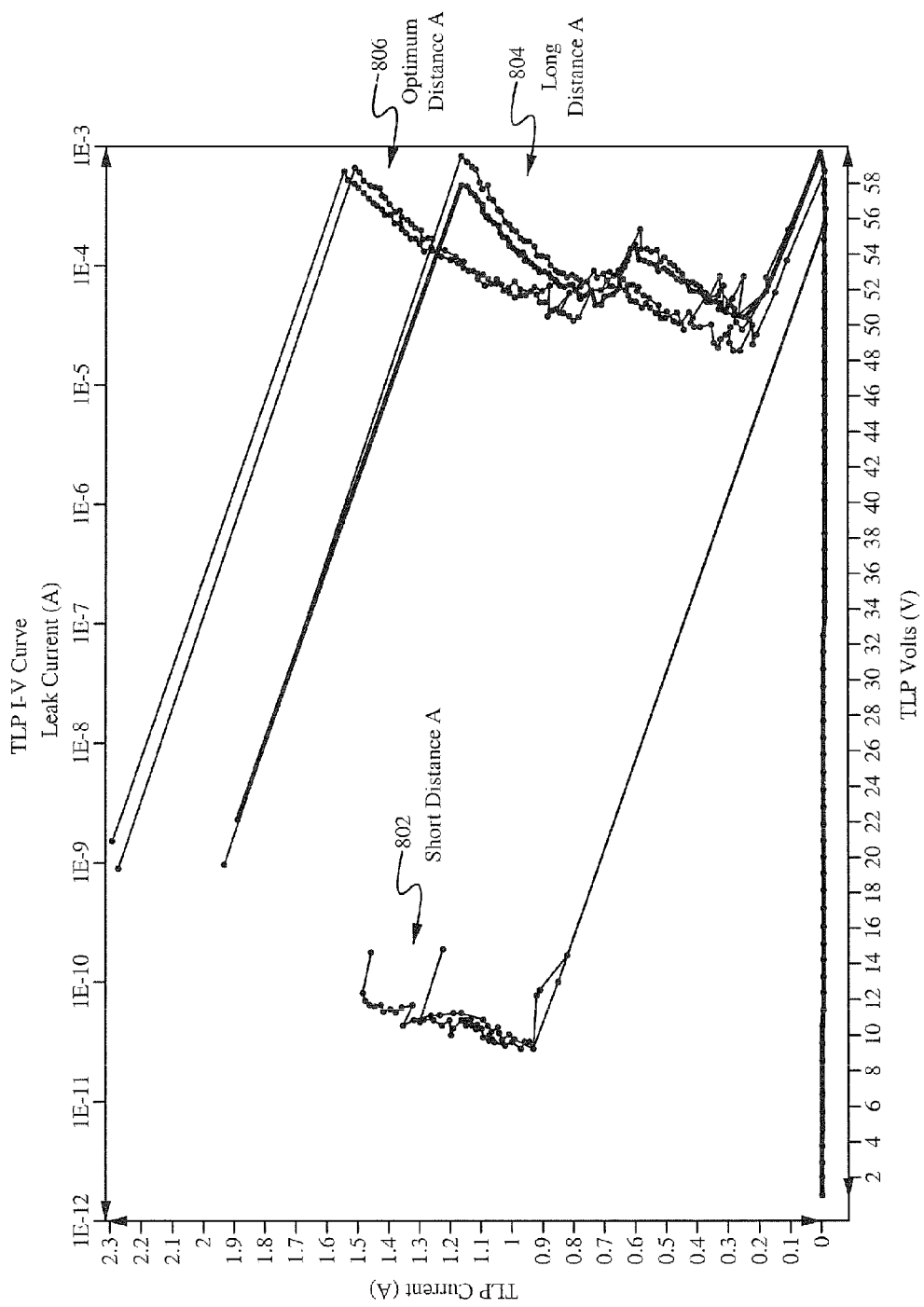
FIG. 9 shows the results of TLP testing, illustrating the effect of emitter-to-collector spacing in accordance with embodiments of the present invention.

FIG. 9 shows the effect of emitter-to-collector spacing on lateral NPN ESD clamp I-V characteristics. This spacing is labeled "A" in FIG. 2A. As shown in FIG. 9, if the spacing is too small, the device will have a very low holding voltage. Small emitter-to-collector spacing (curve 802) will cause punch through after snapback and a collapsed holding voltage. Too large a spacing (curve 804) increases the ON-resistance and reduces the failure current. If the spacing is too large, the entire device will have a lower maximum current rating, that is, the maximum current achieved before thermal breakdown. If the spacing is optimal (curve 806), the device will achieve a high holding voltage above the operating voltage of the device (in this example, 40 V) and a higher final current rating before breakdown. In one embodiment, the spacing "A" between the emitter and collector regions of FIG. 2A is 10 microns or smaller.

Figure 10:
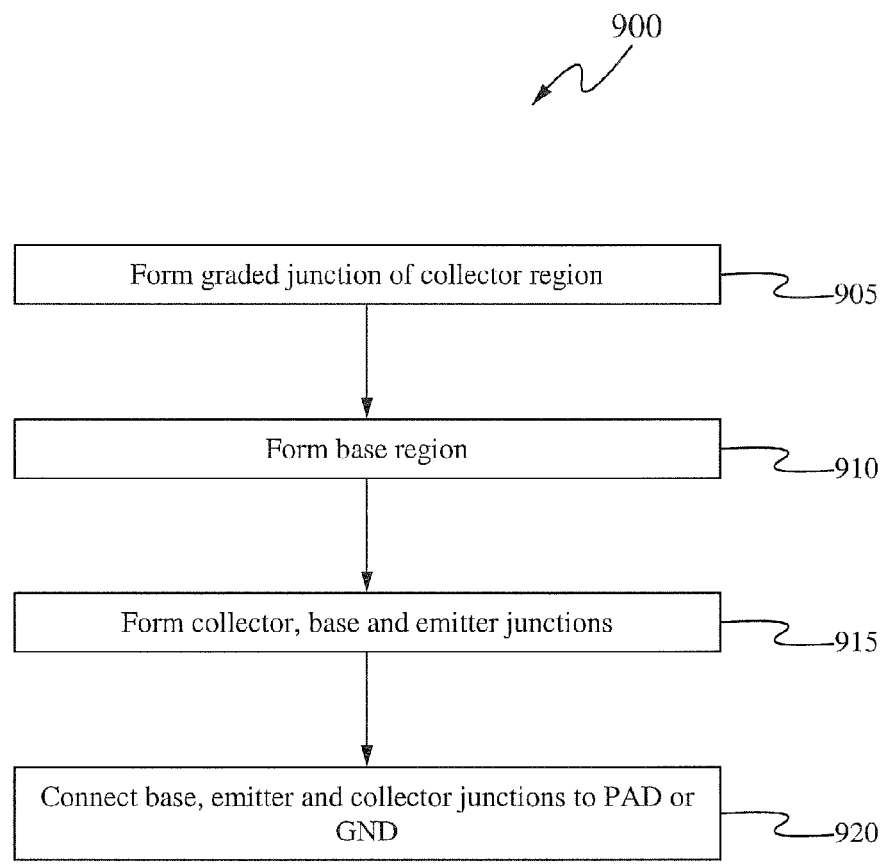
FIG. 10 shows the steps of a process for fabricating a semiconductor device having an ESD protection structure in accordance with one embodiment of the invention.

FIG. 10 shows the steps 900 of a process in accordance with one embodiment of the invention, for fabricating a device incorporating an ESD structure as discussed above. Referring to FIGS. 10 and 2A, in the step 905, the graded junction 210 of the collector region is formed. In the step 910, the base regions HVPW 230 and HVPW 250 are formed. In the step 915, the junctions 220, 235, 240, 255, and 260 are formed. Finally, in the step 920, the regions 235, 240, 255, and 260 are connected to ground, and the region 220 is connected to the PAD 270.

The steps 900 are merely exemplary of one embodiment. Furthermore, the steps 900 can be performed using any number of know techniques including masking, such as by photolithography and etching; and doping, such as by using ion beams or gases. Those skilled in the art will recognize other ways to form semiconductor devices incorporating ESD structures in accordance with embodiments of the invention.

In accordance with embodiments, ESD structures incorporating an internal graded junction protect high-voltage internal circuits from elevated ESD charges. The holding voltage of the protected devices is controlled above a maximum supply voltage so that the device is relatively latch-up free.

These ESD structures are scalable to meet different ESD target levels. These structures can be fabricated using in-house and foundry processes, with little or no modification to existing high-voltage layer fabrication and other process steps.

It will be readily apparent to one skilled in the art that modifications may be made to the embodiments. As one example, the doping types in all the examples can be switched. While FIG. 2A shows a High-Voltage N-Well sandwiched between two High-Voltage P-Wells, in other structures an HVPW is sandwiched between two HVNWs. with corresponding doping types in the nested wells and contacts. And while FIG. 2A shows a single graded junction 210, it will be appreciated that multiple graded junctions can be used to provide additional ESD protection. In this example, the N-well 215 is contained in a second intermediate N-well (not shown) having a smaller doping concentration. Any number of intermediate N-wells can be "nested" to contain wells with increasingly larger doping concentrations. Other modifications can also be made without departing from the spirit and scope of the invention as defined by the appended claims.

We claim:

1. A semiconductor device comprising:
 a circuit element;
 a first electrostatic device in parallel with and electrically connected to the circuit element, wherein the first electrostatic device comprises first and second high-voltage wells having opposite polarities, the first electrostatic device includes a first graded junction;
 a second electrostatic device in parallel with and electrically connected to the circuit element and in parallel with the first electrostatic device, where the second electrostatic device comprises a third high-voltage well of the same polarity and adjacent to the first high-voltage well and a fourth high-voltage well of the same polarity as the second high-voltage well, the second electrostatic device includes a second graded junction; and
 a third electrostatic device in parallel with and electrically connected to the circuit element and in parallel with the first electrostatic device and the second electrostatic device, where the third electrostatic device comprises a fifth high-voltage well and a sixth high-voltage well of the same polarity as the first high-voltage well, the third electrostatic device includes a third graded junction,
 wherein the first electrostatic device, the second electrostatic device, the third electrostatic device, and the circuit element are disposed within a common substrate.

2. The semiconductor device of claim 1, wherein the first graded junction and the second graded junction are formed by an intermediate well within the first high-voltage well, the intermediate well having a doping concentration higher than but of a same polarity as a doping concentration of the first high-voltage well.

3. The semiconductor device of claim 2, wherein the intermediate well forms a collector of the semiconductor device and the second high-voltage well forms a base of the semiconductor device.

4. The semiconductor device of claim 3, wherein a high-doping region in the second high-voltage well forms an emitter of the semiconductor device.

5. The semiconductor device of claim 4, wherein the emitter and the base are grounded, and the collector and the circuit element are both coupled to an input pad that receives an electrostatic discharge event.

6. The semiconductor device of claim 3, wherein the emitter and the collector are separated by a distance that provides a holding voltage above an operating voltage of the circuit element.

7. A semiconductor substrate comprising:
 a first high-voltage circuit element;
 a first electrostatic discharge structure comprising one or more pairs of electrical discharge devices electrically connected to and in parallel with the first high-voltage circuit element, wherein each of the discharge devices comprises adjacent first and second high-voltage wells, wherein the first high-voltage well or the second high-voltage well includes an intermediate well, thereby defining a graded junction, wherein the electrostatic discharge paths within each pair are parallel to each other, and each electrostatic discharge device is coupled to a ground;

a second high-voltage circuit element; and a second electrostatic discharge structure comprising one or more pairs of electrical discharge devices electrically connected to and in parallel with the second high-voltage circuit element, wherein each of the discharge devices comprises adjacent first and second high-voltage wells, wherein the first high-voltage well or the second high-voltage well includes an intermediate well, thereby defining a graded junction, wherein the electrostatic discharge paths within each pair are parallel to each other, and each electrostatic discharge device is coupled to a ground, wherein each electrical discharge device of the first electrostatic discharge structure and the second electrostatic discharge structure is arranged within a fingered configuration within a common substrate, the common substrate including the first high-voltage circuit element, the second high-voltage circuit element, the first electrostatic discharge structure, and the second electrostatic discharge structure.

8. The semiconductor substrate of claim 7, wherein each of the discharge paths is defined by an intermediate well contained in a high-voltage well thereby forming a graded junction.

9. The semiconductor substrate of claim 8, wherein each of the high-voltage wells and intermediate wells have the same polarity.

10. The semiconductor device of claim 8, wherein a ratio of a doping concentration of an intermediate well to a doping concentration of a corresponding high-voltage well is between 10 and 100, inclusive.

11. The semiconductor device of claim 1, wherein the first electrostatic device and the second electrostatic device are both coupled to ground.

12. The semiconductor device of claim 1, wherein the first electrostatic device includes only a single intermediate well and the second electrostatic discharge path only includes a single intermediate well.

13. The semiconductor device of claim 1, wherein the first graded junction is formed by a first intermediate well within the second high-voltage well, the first intermediate well having a doping concentration higher than but of a same polarity as a doping concentration of the second high-voltage well, further wherein the second graded junction is formed by a second intermediate well within the third high-voltage well, the second intermediate well having a doping concentration higher than but of a same polarity as a doping concentration of the third high-voltage well.

14. The semiconductor device of claim 1, wherein the first electrostatic device comprises a first NPN discharge path and the second electrostatic device comprises a second NPN discharge path.

\* \* \* \* \*